United States Patent [19]
Jun et al.

[11] Patent Number: 6,064,119
[45] Date of Patent: *May 16, 2000

[54] WIRING STRUCTURE AND FORMATION METHOD THEREOF FOR SEMICONDUCTOR DEVICE

[75] Inventors: Young-Kwon Jun, Seoul; Yong-Kwon Kim, Choongcheongbook-Do, both of Rep. of Korea

[73] Assignee: LG Semicon Co., Ltd., Choongcheongbuk-Do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 09/079,264

[22] Filed: May 15, 1998

Related U.S. Application Data

[62] Division of application No. 08/770,158, Dec. 19, 1996, Pat. No. 5,786,274.

[30] Foreign Application Priority Data

Dec. 29, 1995 [KR] Rep. of Korea ................. 95/67324

[51] Int. Cl.$^7$ ................................. H01L 23/48
[52] U.S. Cl. ................. 257/773; 257/774; 257/758
[58] Field of Search ................. 438/640, 424, 438/427, 430; 257/774, 758, 764, 773

[56] References Cited

U.S. PATENT DOCUMENTS

| | | | |
|---|---|---|---|
| 4,541,169 | 9/1985 | Bartush | 257/758 |
| 4,556,897 | 12/1985 | Yorikane et al. | 357/71 |
| 5,130,764 | 7/1992 | Cetronio et al. | 357/22 |
| 5,219,792 | 6/1993 | Kim et al. | 437/195 |
| 5,266,525 | 11/1993 | Morozumi | 437/195 |

FOREIGN PATENT DOCUMENTS 402026020  1/1990  Japan ................. 438/363

OTHER PUBLICATIONS

R. Cullet, Process for Interconnecting Different Levels of Metal in an Integrated Circuit. IBM Technical Disclosure Bulletin, vol. 21 No. 7, pp. 2850–2851, Dec. 1978.

Anonymous, Reducing stresses in asymmetrical studs on silicon chips using sacrificial studs, Research Disclosure, No. 340, England, Aug. 1992.

*Primary Examiner*—Steven H. Loke
*Assistant Examiner*—Ori Nadav
*Attorney, Agent, or Firm*—Morgan, Lewis & Bockius LLP

[57] ABSTRACT

A wiring structure of a semiconductor device includes a substrate; a first conductive layer formed in the substrate; an insulation film formed on the substrate including the first conductive layer and having a contact hole therein through which the upper surface of the first conductive layer is exposed, wherein the contact hole includes an upper contact hole and a lower contact hole having a shape undercut into the insulation film and thus being wider than the upper contact hole; and a second conductive layer formed on the insulation film so as to thoroughly fill the contact hole and electrically connected to the first conductive layer.

5 Claims, 8 Drawing Sheets

6,064,119

WIRING STRUCTURE AND FORMATION METHOD THEREOF FOR SEMICONDUCTOR DEVICE

This is a divisional of application Ser. No. 08/770,158 filed on Dec. 19, 1996 now U.S. Pat. No. 5,786,274.

BACKGROUND OF THE INVENTION

1. Field of the Invention

The present invention relates to a wiring structure for a semiconductor device, and more particularly to a wiring structure and formation method thereof for a semiconductor device capable of decreasing a contact resistance by forming a shape provided in a lower portion of a contact hole and undercut into an insulation film.

2. Description of the Prior Art

With a semiconductor circuit increasingly integrated, there is a trend wherein breadth of each conductive wire in semiconductor devices or circuits becomes narrowed.

The decreasing wire breadth in each of the conductive wires also applies to metalization for electrically connecting conductive regions to each other. In addition, the size of a contact hole for contacting a conductive wire to another is decreasing as well.

According to U.S. Pat. No. 4,556,897, during an aluminum applied metallic wiring process a lower and upper wiring layers are contacted to each other in contact holes for maintaining continuity property of aluminum.

However, U.S. Pat. No. 4,556,897 does not provide a solution to an increased contact area and contact resistance when there occurs a misalignment of a mask in forming a contact hole. Besides, it does not apply to a self-aligned contact hole.

With reference to FIG. 1, a conventional wiring structure in a semiconductor device will now be described.

In a portion of the surface of a substrate 1 there is formed a lower conductive layer 2 serving as a conductive wire. After depositing an insulation film 8 on the substrate 1 including the lower conductive wire 2, a contact hole 4 is formed through the insulation film 8 by a selective etching. FIG. 1 also shows a misalignment of the contact hole 4 against the lower conductive layer 2 for a certain reason, which misalignment causes the externally exposed area of the lower conductive layer 2 to be decreased.

Therefore, when there occurs a mask misalignment against the contact hole 4 the area of the conductive wire 2 exposed through the contact hole decreases, whereby the contact resistance increases and accordingly signal transfer in a semiconductor device can be delayed. As a result, the thusly increased resistance may generate current crowing and then electromigration, thereby deteriorating the reliability of a semiconductor device.

SUMMARY OF THE INVENTION

Accordingly, it is an object of the present invention to provide a wiring structure and formation method thereof for a semiconductor device capable of minimizing the area of a conductive wire exposed through a misaligned contact hole.

To achieve the above-described object, the wiring structure of a semiconductor device includes a substrate; a first conductive layer formed in the substrate; an insulation film formed on the substrate including the first conductive layer and having a contact hole therein through which the upper surface of the first conductive layer is exposed, wherein the contact hole includes an upper contact hole and a lower contact hole having a shape undercut into the insulation film and thus being wider than the upper contact hole; and a second conductive layer formed on the insulation film so as to thoroughly fill the contact hole and electrically connected to the first conductive layer.

Further, the fabrication method of a wiring structure of a semiconductor device includes forming a first conductive layer and a victim layer sequentially on a substrate, forming after patterning the victim layer an insulation film on the substrate including the victim layer, forming a contact hole by removing a portion of the insulation so as to expose a portion of the upper surface of the victim layer therethrough, removing the victim layer for exposing the upper surface of the first conductive layer therethrough, forming a second conductive layer on the insulation film so as to thoroughly fill the contact hole, and patterning the second conductive layer to a certain shape.

DETAILED DESCRIPTION OF THE PREFERRED EMBODIMENTS

Figure 1:
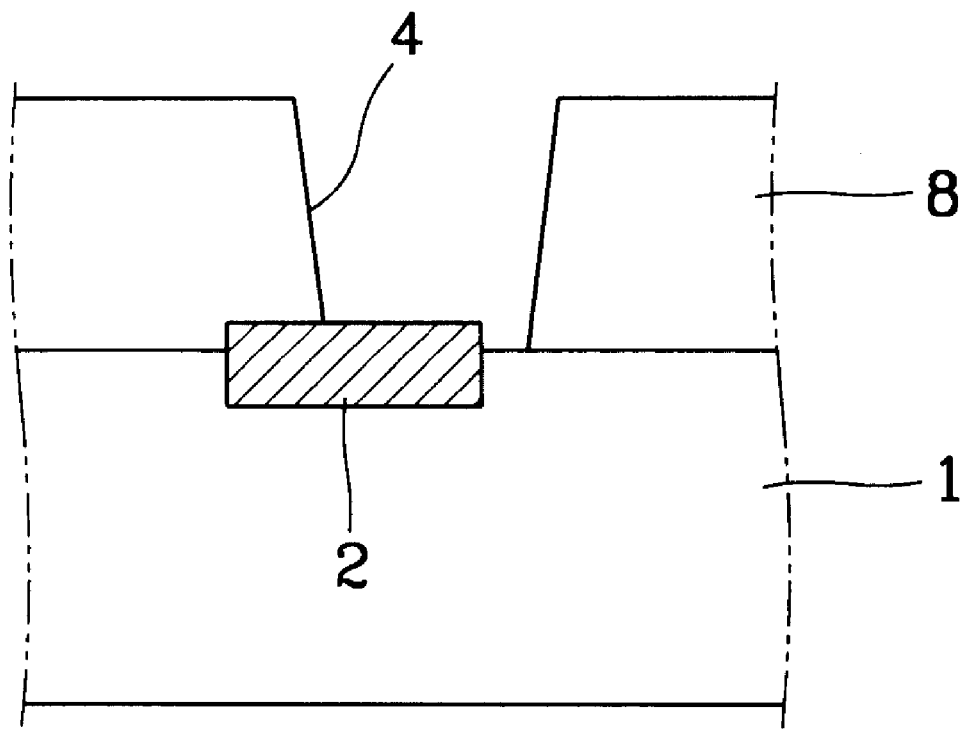
FIG. 1 is a cross-sectional view showing a conventional wiring structure in a semiconductor device.
Figure 2:
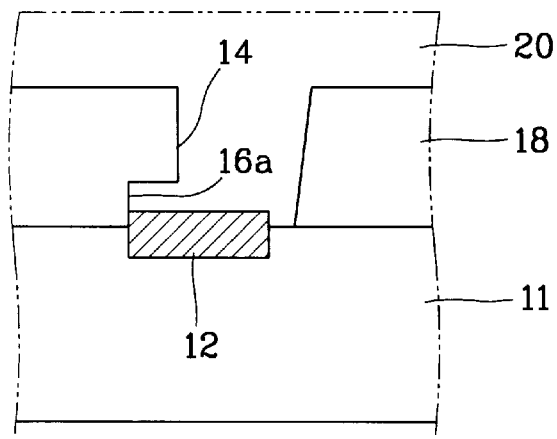
FIG. 2 is a cross-sectional view showing a wiring structure of a semiconductor device in accordance with a first embodiment of the present invention.

As shown in FIG. 2 showing a wiring structure of a semiconductor device in accordance with a first embodiment of the present invention, on a substrate 11 there is provided a lower wiring layer 12 serving as a first conductive layer. An insulation film 18 having a contact hole 14 therein is formed on the substrate 11 including the lower conductive wire 12 first. An upper wiring layer 20 is formed on the insulation film 18 so as to thoroughly fill the contact hole 14 and electrically connected to the lower wiring layer 12. Extending from a lower portion of the contact hole 14, an opening 16a is formed in the insulation film 18, a side of which opening 16a is vertical to the conductive wire 12. Subsequently, even when there occurred a mask misalignment against the contact hole 14, the surface area of the wiring layer 12 for being contacted to the insulation film 18 can be cleared.

Figure 3:
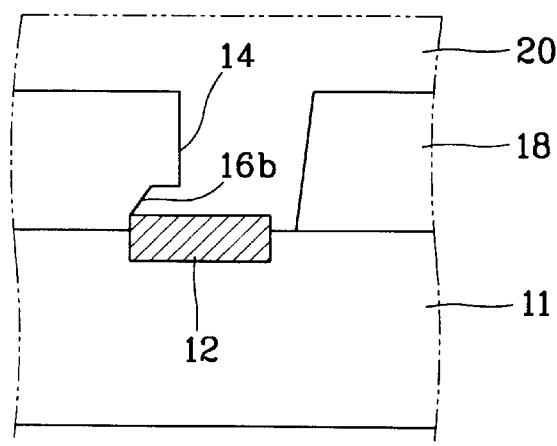
FIG. 3 is a cross-sectional view showing the wiring structure of a semiconductor device in accordance with a second embodiment of the present invention.

In accordance with a second embodiment of the present invention referring to FIG. 3 which is similar to FIG. 2 in its structure, an opening 16b has a slope along the side wall thereof so that the upper surface of the conductive wire 12 can be exposed through the contact hole 14 including the opening 16b. Therefore, as in FIG. 2, even when there occurred a mask misalignment against the contact hole 14, the area of the lower wiring layer 12 for being contacted to the insulation film 18 can be cleared. Thus, an upper wiring layer 20 is formed on the insulation film 18 so as to thoroughly fill the contact hole 14 and electrically connected to the lower wiring layer 12.

Figure 4:
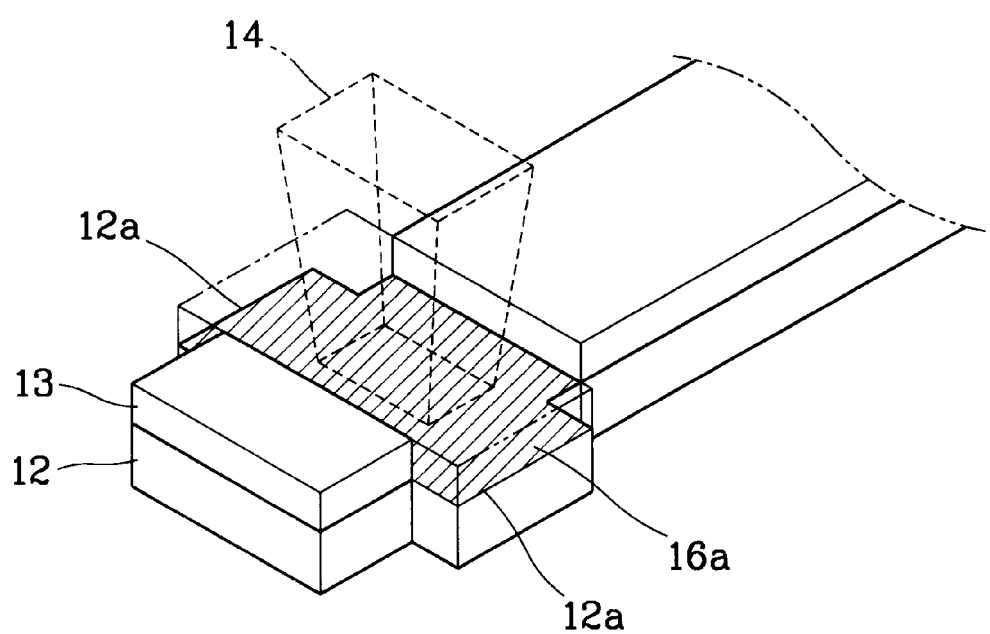
FIG. 4 is a partial perspective view showing the wiring structure of a semiconductor device in accordance with present invention.

Meanwhile, FIG. 4 is a partial perspective view having an enlarged imaginary rectangular column for showing a contact hole layout in the wiring structure of the present invention, wherein the dotted part denotes the upper contact hole 14. The hatched portion in the drawing represents the exposed upper surface of the first conductive layer 12. Also, an edge 12a provided at each of the front and back in the wiring structure but not shown in the other drawings is formed to maximize the area of the first conductive layer 12 exposed through the contact hole 14 including an opening 16a.

Figure 5A:
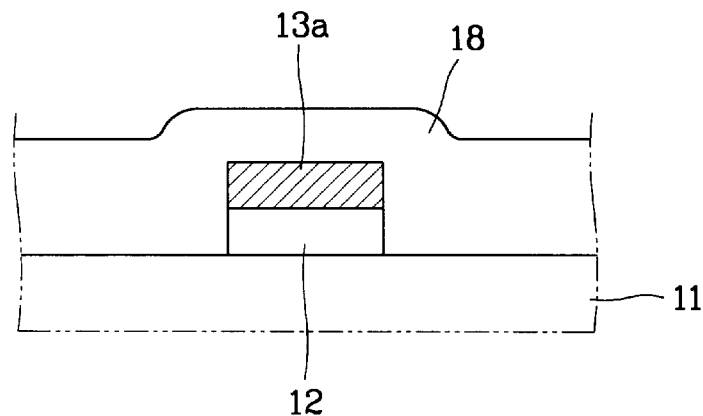
FIGS. 5A through 5D are cross-sectional views each for showing a forming method of the wiring structure of a semiconductor device in accordance with the first embodiment of the present invention.
Figure 5B:
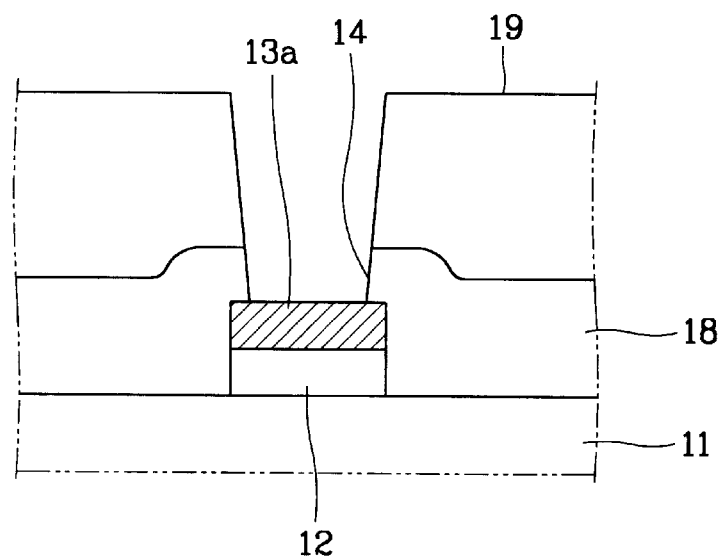
Figure 5C:
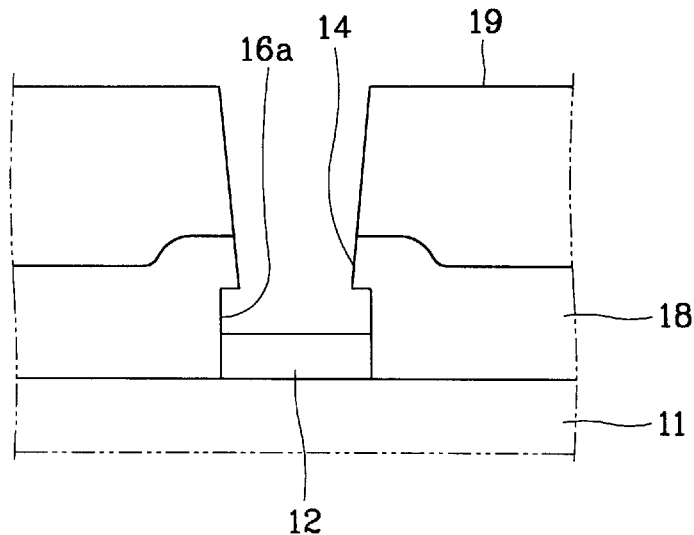
Figure 5D:
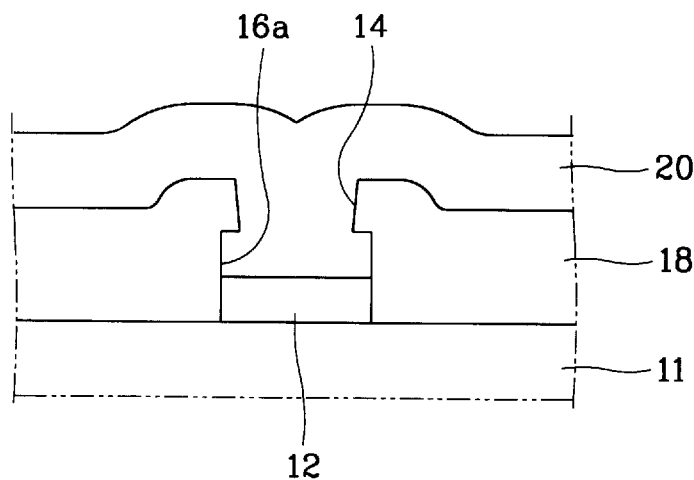

With reference to FIG. 5D, the wiring structure in accordance with the first embodiment of the present invention includes the substrate 11, the first conductive layer 12 formed on the substrate 11, the insulation film 18 having a contact hole through which the upper surface of the first conductive layer 12 is exposed, and a second conductive layer 20 filling the contact hole thoroughly for electrically being connected to the first conductive layer 12.

The contact hole includes an upper contact hole 14 and a lower contact hole 16a having a shape undercut into the insulation film 18 and thus being wider than the upper contact hole 14. Each side wall of the lower contact hole 16a is vertical to the first conductive layer 12.

With reference to FIGS. 5A through 5D, the fabrication steps of the wiring structure in accordance with the first embodiment will now be described.

First, as shown in FIG. 5A, on a substrate 11 there is patterned a structure sequentially laminated with a first conductive layer 12 and a victim layer 13a.

As shown in FIG. 5B, using a photo resist film 19 as a mask an insulation film 18 is selectively etched to form the upper contact hole 14.

As shown in FIG. 5C, the victim layer 13a is removed therefrom by a etching method for thereby forming the lower contact hole 16a.

As shown in FIG. 5D, the photo resist film 19 is removed therefrom and then a second conductive layer 20 serving as an upper conductive wire is formed on the insulation film 18 including the contact hole by means of a technique such as a chemical vapor deposition (CVD). Thereafter, the surface of the second conductive layer 20 is patterned to a certain shape.

The insulation film 18, as shown in FIG. 5A, is formed as a single structure composed of a silicon oxide film by applying thereto a plasma CVD, or as a laminated structure composed of an ointment silicon oxide film such as SOG (silicon on glass) and a silicon oxide film applied to a plasma CVD. The victim layer 13a is formed of an insulation material such as silicon nitride which has etch selectivity against each of a silicon oxide film and an aluminum film which serves as the first conductive layer 12, or of a conductive material such as TiW or W.

The victim layer 13a, as shown in FIG. 5B, serves as an etching stopper when etching an insulation film. Anisotropic dry etching in which to employ gas such as $CF_4$ or $CHF_4$ can be applied to etch the insulation film 18. The upper contact hole 14 is provided by etching the insulation film 18 but the lower contact hole 16a provided above the first conductive layer 12 is formed by removing the victim layer 13a by applying thereto an etch selectivity.

Therefore, the lower contact hole 16a constantly secures a wider space than the upper contact hole 14, thereby becoming a self-aligned contact hole for exposing the surface of the first conductive layer 12 therethrough.

To remove the victim layer 13a as shown in FIG. 5C, a dry etching technique using a solution of $H_3PO_4$ or an isotropic dry etching technique using gas such as $SF_6$ can be applied thereto.

In FIG. 5D, a CVD technique is employed to sufficiently coat all the walls of the lower contact hole 16a with a conductive material by applying thereto a heat dissolution technique.

Figure 6A:
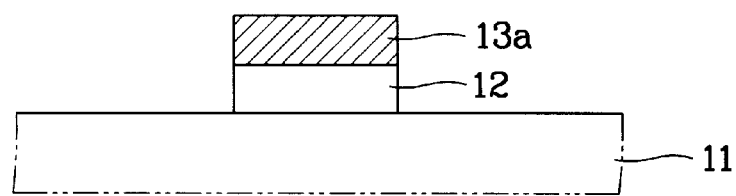
FIGS. 6A through 6F are cross-sectional views each for showing a forming method of the wiring structure of a semiconductor device in accordance with the second embodiment of the present invention.
Figure 6B:
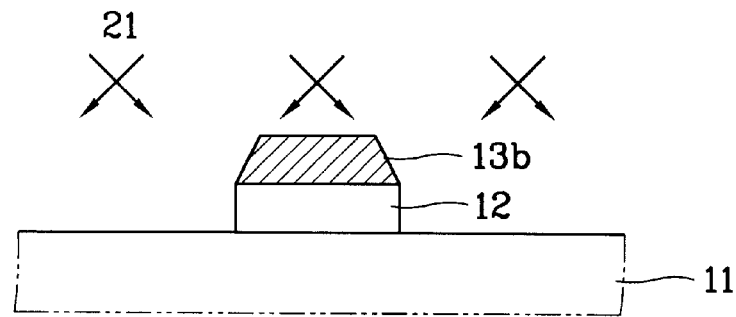
Figure 6C:
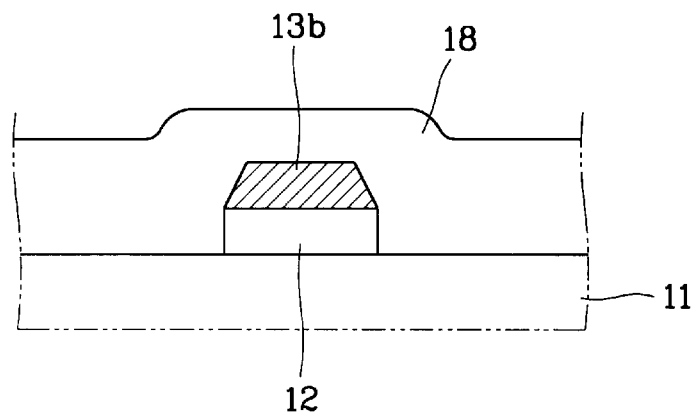
Figure 6D:
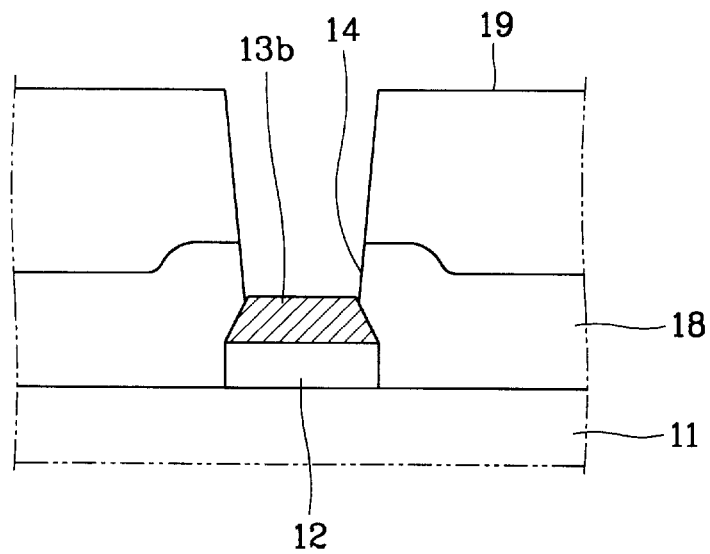
Figure 6E:
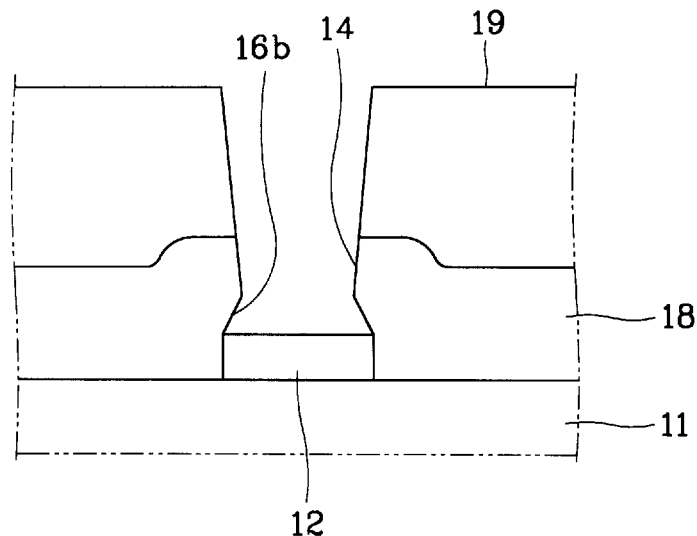
Figure 6F:
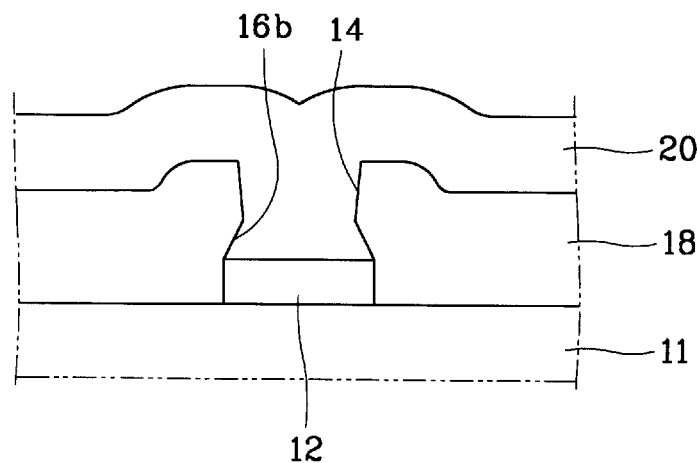

Referring to FIG. 6F, the second embodiment of the present invention includes the substrate 11, the first conductive layer 12 formed on the substrate 11, the insulation film 18 formed on the substrate 11 and the first conductive layer 12 but having a contact hole therein through which the upper surface of the first conductive layer 12 is exposed, and the second conductive layer 20 formed on the insulation film 18 and also filling the contact hole thoroughly for electrically being connected to the first conductive layer 12.

The contact hole includes an upper contact hole 14 and a lower contact hole 16a having a shape undercut into the insulation film 18 and thus being wider than the upper contact hole 14. Each side wall of the lower contact hole 16a is slanted to the first conductive layer 12.

With reference to FIGS. 6A through 6F, the fabrication steps of the wiring structure in accordance with the second embodiment will now be described.

First, as shown in FIG. 6A, on a substrate 11 there is patterned a structure sequentially laminated with a first conductive layer 12 and a victim layer 13a.

As shown in FIG. 6B, using a plasma of halogen gas such as Ar, each edge of the victim layer 13a is etched by a sputtering technique, thereby forming an edge-etched victim layer 13b.

As shown in FIG. 6C, an insulation film 18 for insulating conductive layers is formed on the substrate 11 including the edge-etched victim layer 13b formed on the first conductive layer 12.

As shown in FIG. 6D, using a photo resist film 19 formed on the insulation film 18 as a mask, the insulation film 18 is etched to form an upper contact hole 14 therethrough.

As shown in FIG. 6E, the edge-etched victim layer 13b is removed therefrom by applying thereto etch selectivity for thus forming a lower contact hole 16b.

As shown in FIG. 6F, the photo resist film 19 is removed therefrom and then a second conductive layer 20 serving as an upper conductive wire is formed on the insulation film 18 including the contact hole by means of a technique such as a chemical vapor deposition (CVD). Thereafter, the surface of the second conductive layer 20 is patterned to a certain shape.

Meanwhile, the etching step in FIG. 6B serves to improve the quality of coating a conductive material on all the sides of the lower contact hole 16b in FIG. 6F and accordingly a physical deposition technique such as sputtering, as well as a CVD technique can be applied thereto.

To form the first and second conductive layers which are incorporated into each of the first aid second embodiments of the present invention, a highly conductive metal such as Cu or Pt, or their compound metal, as well as a conventionally employed aluminum or its compound metal, can be applied thereto.

According to the wiring structure and its forming method of the present invention as described above, although there occurred a mask misalignment against the lower conductive layer and the contact hole, the self-aligned lower contact hole maximizes the surface area of the first conductive layer being exposed through the contact hole, thereby reducing a contact resistance and also obtaining a high reliability in semiconductor devices.

What is claimed is:

1. A wiring structure of a semiconductor device, comprising:

a substrate;

a first conductive layer formed in the substrate, the first conductive layer having a portion being below the surface of the substrate and a portion extending above the surface of the substrate;

an insulation film formed on the substrate including the first conductive layer and having a contact hole therein through which the upper surface of the first conductive layer is exposed, wherein the contact hole includes an upper contact hole and a lower contact hole having a shape undercut into the insulation film and thus being wider than the upper contact hole; and a second conductive layer formed on the insulation film so as to throughly fill the contact hole and electrically connected to the first conductive layer, the second conductive layer substantially filling the undercut shape of the lower contact hole so that the second conductive layer directly contacts both the first conductive layer and the substrate.

2. The wiring structure of claim 1, wherein the lower contact hole has a side wall perpendicular to the first conductive layer.

3. The wiring structure of claim 1, wherein the lower contact hole has a side wall inclined with respect to the first conductive layer.

4. The wiring structure of claim 1, wherein the insulation film includes a silicon oxide film formed using a plasma enhanced chemical vapor deposition (PECVD) technique.

5. The wiring structure of claim 1, wherein the insulation film includes a structure laminated with SOG (spin on glass) layer and a silicon oxide film formed using a plasma enhanced chemical vapor deposition (PECVD) technique.

* * * * *